United States Patent
Ban et al.

(10) Patent No.: US 11,443,805 B2
(45) Date of Patent: *Sep. 13, 2022

(54) ELECTRONIC DEVICE AND METHOD OF OPERATING MEMORY CELL IN THE ELECTRONIC DEVICE

(71) Applicant: SK hynix Inc., Icheon (KR)

(72) Inventors: Sang Hyun Ban, Icheon (KR); Beom Seok Lee, Icheon (KR); Woo Tae Lee, Icheon (KR); Tae Hoon Kim, Icheon (KR); Hwan Jun Zang, Icheon (KR); Hye Jung Choi, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/131,456

(22) Filed: Dec. 22, 2020

(65) Prior Publication Data

US 2021/0110871 A1    Apr. 15, 2021

Related U.S. Application Data

(63) Continuation-in-part of application No. 17/039,480, filed on Sep. 30, 2020, now Pat. No. 11,264,095, (Continued)

(30) Foreign Application Priority Data

Jun. 4, 2019    (KR) .................. 10-2019-0066089

(51) Int. Cl.
*G11C 11/00* (2006.01)
*G11C 13/00* (2006.01)

(52) U.S. Cl.
CPC ........ *G11C 13/0097* (2013.01); *G11C 13/004* (2013.01); *G11C 13/0069* (2013.01); (Continued)

(58) Field of Classification Search
CPC .............. G11C 13/0097; G11C 13/004; G11C 13/0069; G11C 2013/005; G11C 2013/009; G11C 2213/15
(Continued)

(56) References Cited

U.S. PATENT DOCUMENTS 8,081,506 B2   12/2011  Kuo et al.
10,818,730 B2  10/2020  Yamakawa
(Continued)

FOREIGN PATENT DOCUMENTS

KR    101196933 B1    11/2012

OTHER PUBLICATIONS

Non-Final Office Action dated May 19, 2021 for U.S. Appl. No. 17/039,480.

*Primary Examiner* — Huan Hoang

(57) ABSTRACT

An electronic device includes a semiconductor memory. The semiconductor memory includes word lines, bit lines intersecting the word lines, and memory cells coupled to and disposed between the word lines and the bit lines, each of the memory cells including a variable resistance layer in an amorphous state regardless of a value of data stored in the memory cells. In a reset operation, a memory cell is programmed to a high-resistance amorphous state by applying, to the memory cell, a sub-threshold voltage that is lower than a lowest threshold voltage among threshold voltages of the memory cells.

20 Claims, 11 Drawing Sheets

Related U.S. Application Data which is a continuation of application No. 16/687,384, filed on Nov. 18, 2019, now Pat. No. 10,825,519.

(52) U.S. Cl.
 CPC .. *G11C 2013/005* (2013.01); *G11C 2013/009* (2013.01); *G11C 2213/15* (2013.01)

(58) Field of Classification Search
 USPC .......................................................... 365/163
 See application file for complete search history.

(56) References Cited

U.S. PATENT DOCUMENTS

| | | | |
|---|---|---|---|
| 10,825,519 B1 * | 11/2020 | Ban | G11C 13/0097 |
| 2008/0212363 A1 | 9/2008 | Fuji | |
| 2012/0037872 A1 * | 2/2012 | Ikarashi | G11C 13/0007 257/2 |
| 2014/0036570 A1 | 2/2014 | Lee et al. | |
| 2020/0118626 A1 * | 4/2020 | Lee | H01L 27/2463 |

* cited by examiner

ELECTRONIC DEVICE AND METHOD OF OPERATING MEMORY CELL IN THE ELECTRONIC DEVICE

CROSS-REFERENCE TO RELATED APPLICATION

This application is a continuation-in-part application of U.S. patent application Ser. No. 17/039,480, filed Sep. 30, 2020, which is a continuation of U.S. patent application Ser. No. 16/687,384, filed Nov. 18, 2019 and now issued as U.S. Pat. No. 10,825,519, which claims priority to Korean patent application number 10-2019-0066089 filed on Jun. 4, 2019, the entire disclosure of which is incorporated by reference herein.

BACKGROUND

1. Technical Field

Embodiments of the present disclosure generally relate to a memory circuit or device, and an application thereof in an electronic device.

2. Related Art

Recently, as electronic devices or appliances trend toward miniaturization, low power consumption, high performance, multi-functionality, and the like, there has been a demand for semiconductor devices capable of storing data in various electronic devices or appliances such as a computer, a portable communication device, and the like. Thus, research has been conducted for semiconductor devices capable of storing data using a characteristic that the semiconductor devices are switched between different resistant states according to a voltage or current applied thereto. Examples of the semiconductor devices include a resistive random access memory (RRAM), a phase change random access memory (PRAM), a ferroelectric random access memory (FRAM), a magnetic random access memory (MRAM), an E-fuse, and the like.

SUMMARY

Embodiments provide an electronic device for stably reading data from a resistive memory.

In accordance with an aspect of the present disclosure, there is provided an electronic device comprising a semiconductor memory, wherein the semiconductor memory comprises: word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells.

In accordance with another aspect of the present disclosure, there is provided a method for operating an electronic device including memory cells, the method comprising: performing a reset operation of programming a selected memory cell among the memory cells to a high-resistance amorphous state by applying a sub-threshold voltage to the selected memory cell, wherein the sub-threshold voltage is lower than a lowest threshold voltage among threshold voltages of the memory cells, and wherein each of the memory cells includes a variable resistance layer in an amorphous state regardless of a value of data stored in the memory cell.

In accordance with still another aspect of the present disclosure, there is provided a method for manufacturing an electronic device including memory cells, the method comprising: forming memory cells each including a variable resistance layer in an amorphous state regardless of a value of data stored in the memory cells; measuring threshold voltages of the memory cells; and setting a sub-threshold voltage to be lower than a lowest threshold voltage among the threshold voltages of the memory cells, wherein a reset operation of programming a selected memory cell among the memory cells to a high-resistance amorphous state is performed by applying the sub-threshold voltage to the selected memory cell.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
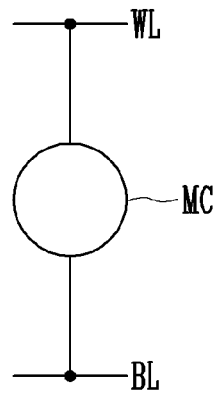
FIG. 1 illustrates a memory cell included in an electronic device in accordance with an embodiment of the present disclosure.

Hereinafter, various embodiments will be described in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). In a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. Throughout the disclosure, like reference numerals refer to like parts throughout the various figures and embodiments of the present disclosure.

FIG. 1 illustrates a memory cell included in an electronic device in accordance with an embodiment of the present disclosure.

Referring to FIG. 1, the electronic device may include a semiconductor memory, and the semiconductor memory may include a row line and a column line. The row line may be a word line, and the column line may be a bit line. The word line and the bit line are relative concepts. Therefore, in another embodiment, the row line may be a bit line and the column line may be a word line. Herein, it is assumed that the row line is a word line WL and the column line is a bit line BL.

The semiconductor memory may include a memory cell MC connected to and disposed between a bit line BL and a word line WL. The memory cell MC may include an Ovonic Threshold Switching (OTS) characteristic, and a threshold voltage of the memory cell MC is changed by a write operation, so that the memory cell MC can be programmed to store data.

The memory cell MC may include a variable resistance layer having the OTS characteristic. The variable resistance layer has one phase, and the phase of the variable resistance layer is not changed in an operation of the memory cell MC. The phase of the variable resistance layer may be an amorphous state, and the state of the variable resistance layer is not changed to a crystalline state in a write operation of the memory cell MC. For example, the variable resistance layer may include a chalcogenide-based material such as Ge, Sb, Te, As, Se, Si, In, S, or Ga. The variable resistance layer may be a chalcogenide layer in an amorphous state. The variable resistance layer may have at least two resistance states. The variable resistance layer may have a high-resistance amorphous state or a low-resistance amorphous state.

The threshold voltage of the memory cell MC is changed depending on a program pulse applied to the memory cell MC, and the memory cell MC may be programmed to at least two states, e.g., the a high-resistance amorphous state and the low-resistance amorphous state, by changing the threshold voltage. When the variable resistance layer has the high-resistance amorphous state, the memory cell MC has a high threshold voltage. An operation of programming the memory cell MC to the high-resistance amorphous state is referred to as a reset operation, and the memory cell MC is programmed to a reset state by the reset operation. On the other hand, when the variable resistance layer has the low-resistance amorphous state, the memory cell MC has a low threshold voltage. An operation of programming the memory cell MC to the low-resistance amorphous state is referred to as a set operation, and the memory cell MC is programmed to a set state by the set operation.

A read operation is performed to read data stored in the memory cell MC. When a read voltage is applied to both ends of the memory cell MC, the memory cell MC is in a conduction state or a non-conduction state according to a value of data stored in the memory cell MC. That is, the memory cell MC is turned on or turned off by the read voltage.

Therefore, the variable resistance layer having the OTS characteristic, which is included in the memory cell MC, may serve as a memory element as well as a selection element. In other words, the memory cell MC may not include a memory element such as a phase change element.

Figure 2:
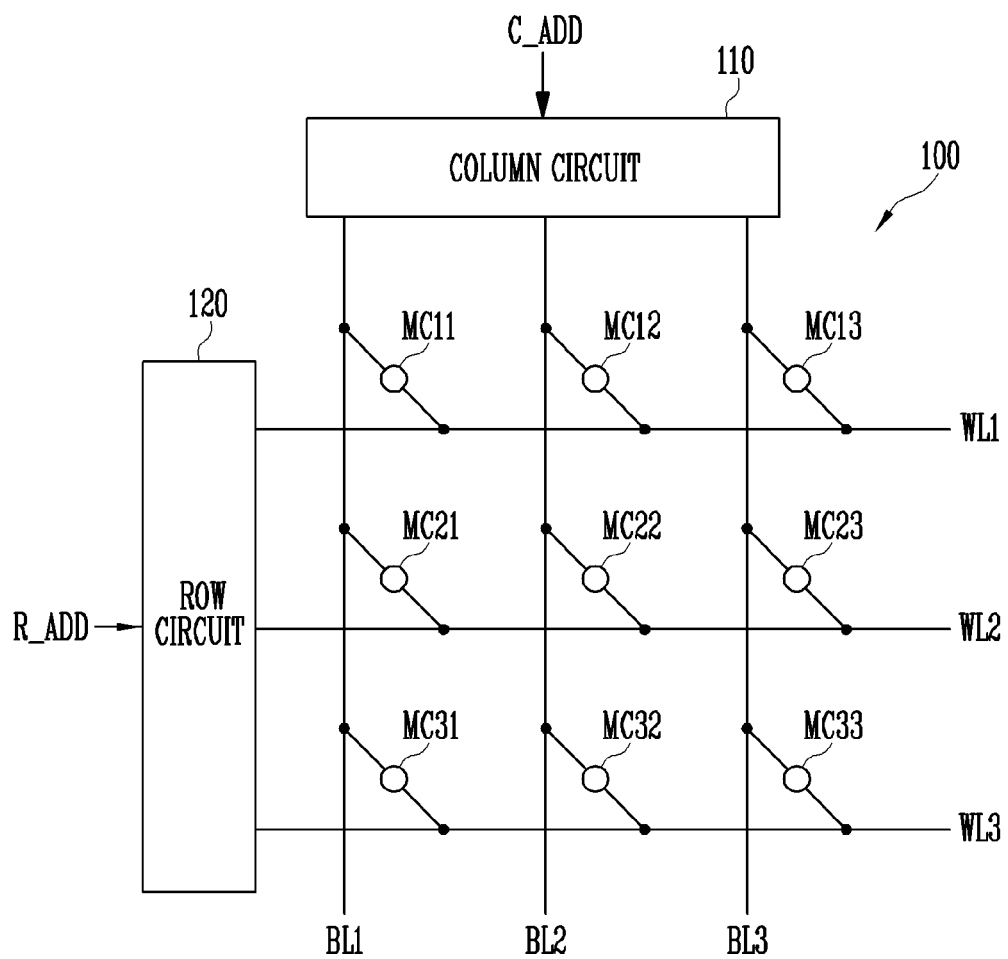
FIG. 2 illustrates a memory cell array included in an electronic device in accordance with an embodiment of the present disclosure.

FIG. 2 illustrates a memory cell array 100 included in an electronic device in accordance with an embodiment of the present disclosure.

Referring to FIG. 2, the electronic device may include a semiconductor memory, and the semiconductor memory may include a plurality of word lines, e.g., WL1 to WL3, and a plurality of bit lines, e.g., BL1 to BL3, intersecting the plurality of word lines WL1 to WL3. Also, the semiconductor memory may include a plurality of memory cells, e.g., MC11 to MC33, respectively located at intersection points of the plurality of bit lines BL1 to BL3 and the plurality of word lines WL1 to WL3.

The semiconductor memory may further include a column circuit 110 for controlling the bit lines BL1 to BL3 and a row circuit 120 for controlling the word lines WL1 to WL3. The row circuit 120 may be a row decoder, a word line decoder, a word line driver, or the like. The row circuit 120 may select one of the row lines WL1 to WL3 based on a row address R_ADD. The column circuit 110 may be a column decoder, a bit line decoder, a bit line driver, or the like. The column circuit 110 may select one of the column lines BL1 to BL3 based on a column address C_ADD. Accordingly, a memory cell connected to and disposed between the selected column line and the selected row line may be selected.

Although FIG. 2 illustrates the memory cell array 100 that includes the three bit lines BL1 to BL3 and the three word lines WL1 to WL3, it is merely for convenience of description, and embodiments are not limited thereto. The number of bit lines and the number of word lines, which are included in the cell array 100, may be changed, if necessary.

Figure 3:
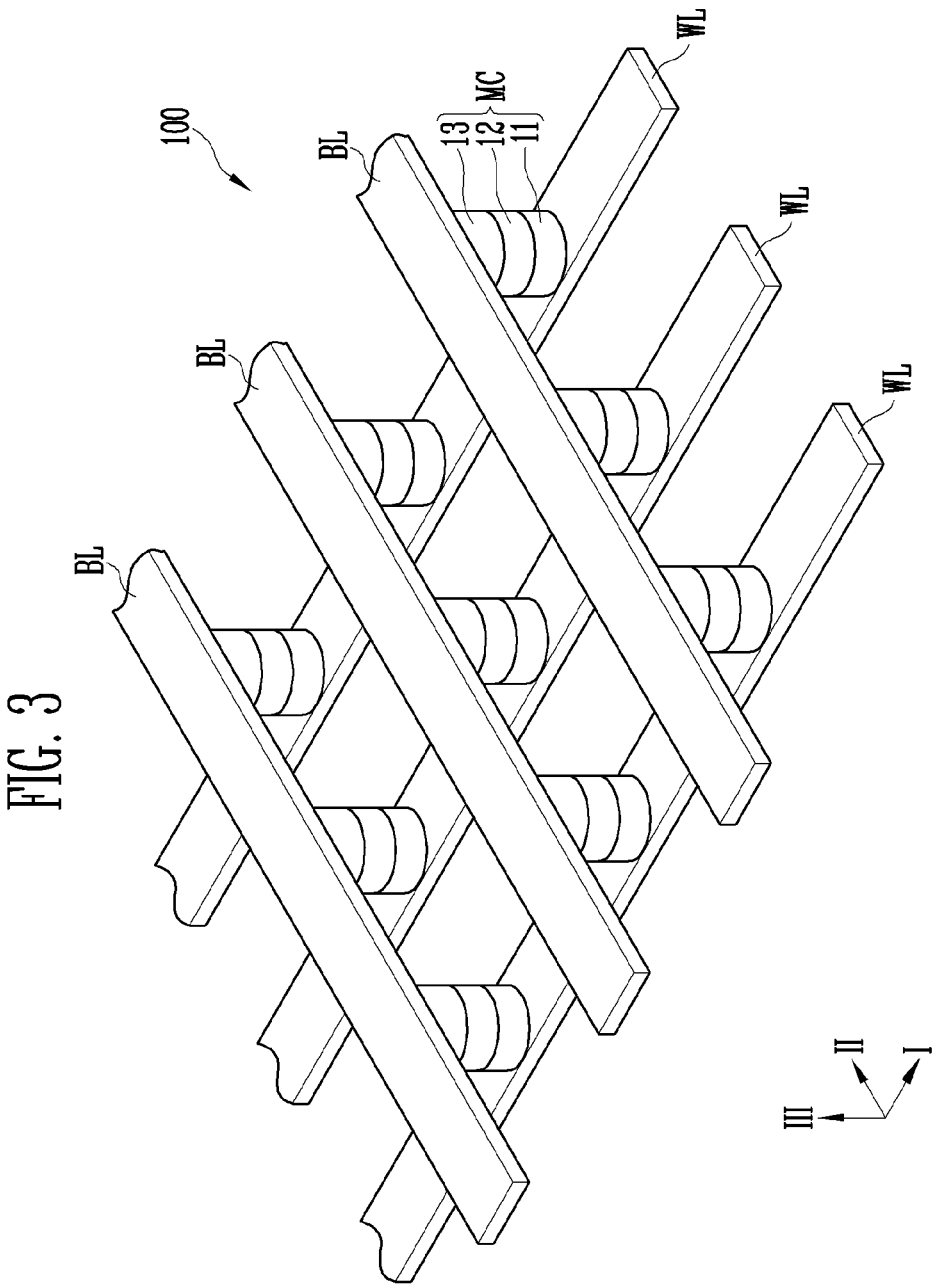
FIG. 3 illustrates a perspective view of a memory cell array included in an electronic device in accordance with an embodiment of the present disclosure.

FIG. 3 illustrates a perspective view of a memory cell array included in an electronic device in accordance with an embodiment of the present disclosure.

Referring to FIG. 3, a memory cell array 100 may include column lines BL and row lines WL, which are located at different levels in a stacked structure. The column lines BL may be located above the row lines WL or be located under the row lines WL. The row lines WL may extend in a first direction I, and the column lines BL may extend in a second direction II intersecting the first direction I.

Memory cells MC may be respectively disposed at intersection points of the column lines BL and the row lines WL. Each of the memory cells MC may include a lower electrode 11, a variable resistance layer 12, and an upper electrode 13 that are stacked in a third direction III. The third direction III is a direction intersecting the first direction I and the second direction II, and may be a direction perpendicular to a plane defined by the first direction I and the second direction II. Although a case where each of the memory cells MC includes the variable resistance layer 12 is illustrated in FIG. 3, the variable resistance layers 12 of the memory cells MC may be connected to each other. For example, the memory cells MC may share the variable resistance layer 12.

The column lines BL, the memory cells MC, and the row lines WL may constitute one deck. A plurality of decks may be stacked in the third direction III. The cell array 100 may have a multi-deck structure in which row lines and column lines are alternately stacked in the third direction III. Therefore, adjacent decks in the third direction III may share the row lines WL or the column lines BL.

According to the structure described above with reference to FIG. 3, the memory cells MC are arranged in a cross-point array structure, and are stacked to form a multi-deck structure, so that the degree of integration of memory cells can be improved.

Figure 4A:
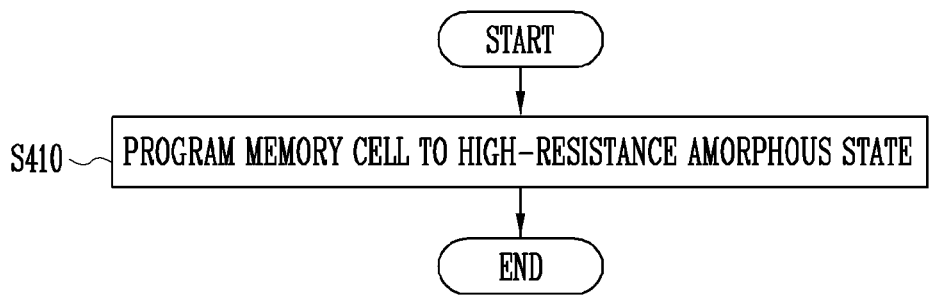
FIG. 4A is a flowchart illustrating a reset operation of a memory cell in accordance with an embodiment of the present disclosure.
Figure 4B:
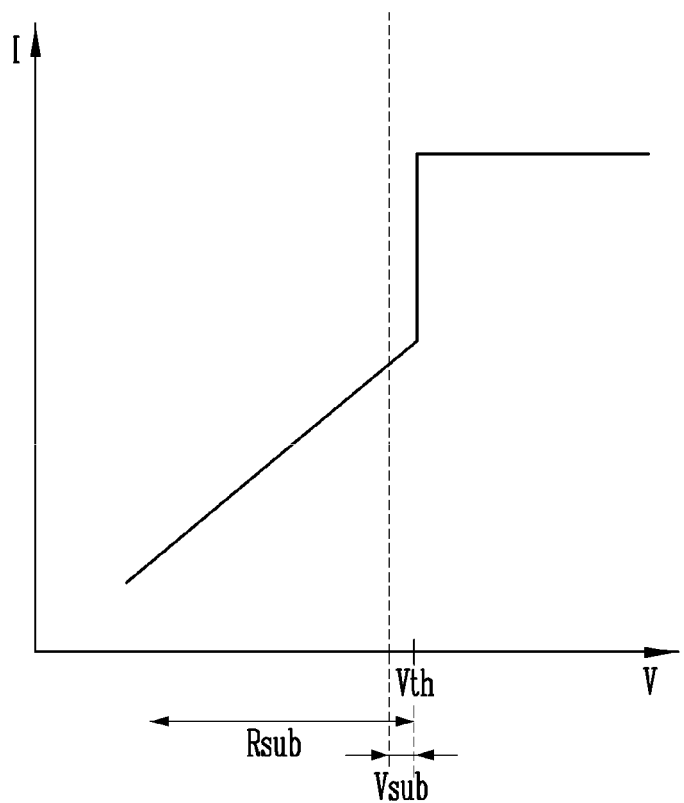
FIGS. 4B and 4C are graphs illustrating I-V curves of the memory cell.
Figure 4C:
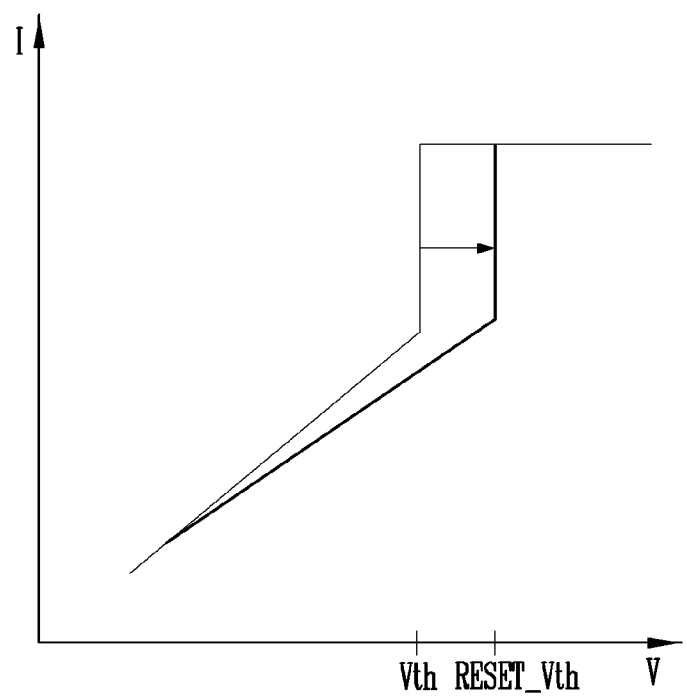

FIGS. 4A to 4C illustrate a method of operating a memory cell in accordance with an embodiment of the present disclosure. FIG. 4A is a flowchart illustrating a reset operation of the memory cell, and FIGS. 4B and 4C are graphs illustrating I-V curves of the memory cell. In FIGS. 4B and 4C, the X-axis represents a voltage V applied to both ends of the memory cell, and the Y-axis represents a current I flowing in the memory cell.

In this embodiment, the memory cell includes a variable resistance layer having the OTS characteristic.

Referring to FIG. 4A, in the reset operation, a sub-threshold voltage is applied to the memory cell (S410). Accordingly, the memory cell is programmed to a high-resistance amorphous state, and the memory cell maintains a non-conduction state, i.e., a turn-off state during the reset operation. Since the variable resistance layer of the memory cell has the OTS characteristic, the variable resistance layer is not phase-shifted, and thus maintains an amorphous state.

The reset operation will be described with reference to FIGS. 4B and 4C. Referring to FIGS. 4B and 4C, a threshold voltage Vth of the memory cell varies depending on a resistance state of the variable resistance layer. Also, the threshold voltage Vth of the memory cell may be changed depending on stress applied to the memory cell.

When a voltage in a voltage range (hereinafter, referred to as a sub-threshold voltage range Rsub) that has a level lower than the threshold voltage Vth is applied to the both ends of the memory cell, the threshold voltage Vth of the memory cell is changed. For example, when a program voltage in the sub-threshold voltage range Rsub is applied to the memory cell, the variable resistance layer is structurally changed by an off-current flowing in the memory cell. For example, the trap density, activation energy, and the like of the variable resistance layer are changed. By this structural change in the variable resistance layer, the resistance state of the variable resistance layer may be changed while maintaining the amorphous state of the variable resistance layer.

The degree to which the threshold voltage Vth of the memory cell increases may vary depending on a level of the program voltage applied to the memory cell or a time for which the program voltage is applied to the memory cell. For example, the threshold voltage Vth of the memory cell further increases as the program voltage having a voltage level closer to the threshold voltage Vth in the sub-threshold voltage range Rsub is applied to the memory cell. Alternatively, the threshold voltage Vth of the memory cell further increases as the time for which the program voltage is applied to the memory cell becomes longer.

Thus, in the embodiment of the present disclosure, the threshold voltage Vth may increase by applying the program voltage in the sub-threshold voltage range Rsub to the memory cell, so that the reset operation is performed. Accordingly, the memory cell is programmed to the high-resistance amorphous state, i.e., the reset state, and has a threshold voltage RESET_Vth in the reset state. Since a voltage in the sub-threshold range Rsub is used as the program voltage in the reset operation, the memory cell may not be turned on during the reset operation and may be programmed to the high-resistance amorphous state.

At this time, a sub-threshold voltage Vsub is applied to the memory cell as the program voltage so as to sufficiently secure a read margin. The sub-threshold voltage Vsub is within the sub-threshold voltage range Rsub, and is selected to have a level that is lower than and close to a level of the threshold voltage Vth.

When a voltage greater than 0.95 times of the threshold voltage Vth is applied to the memory cell, the memory cell may be turned on such that the high-resistance amorphous state of the memory cell is changed to a low-resistance amorphous state. In addition, when a voltage smaller than 0.7 times of the threshold voltage Vth is applied to the memory cell, sufficient stress cannot be applied to the memory cell. That is, since a sufficient amount of off-current does not flow in the memory cell, the threshold voltage Vth of the memory cell does not increase. Thus, in the embodiment of the present disclosure, the sub-threshold voltage Vsub is selected to have a value that is greater than 0.7 times of the threshold voltage Vth and smaller than 0.95 times of the threshold voltage Vth. As described above, the sub-threshold voltage Vsub is selected to have a value closest to the threshold voltage Vth, so that the threshold voltage Vth of the memory cell can sufficiently increase when the memory cell is programmed to the reset state. The read margin is determined by a difference between the threshold voltage Vth i.e., a threshold voltage SET_Vth in the set state and the increased threshold voltage, i.e., the threshold voltage RESET_Vth in the reset state. As a result, the read margin can be secured.

In addition, the sub-threshold voltage Vsub may be applied as a single pulse to the memory cell or be applied as a plurality of pulses to the memory cell. When the sub-threshold voltage Vsub is applied as the plurality of pulses, each pulse may have a short pulse width. The threshold voltage Vth may further increase as a width of a pulse applied to the memory cell becomes longer.

According to the above-described method of operating the memory cell, the reset operation is performed using the sub-threshold voltage Vsub. Therefore, a write operation can be performed using a lower current compared to the conventional write operation in which a program voltage that is greater than the threshold voltage Vth is used. Thus, power consumption in the write operation can be reduced, and a low power device can be implemented by employing the above-described method.

Figure 5:
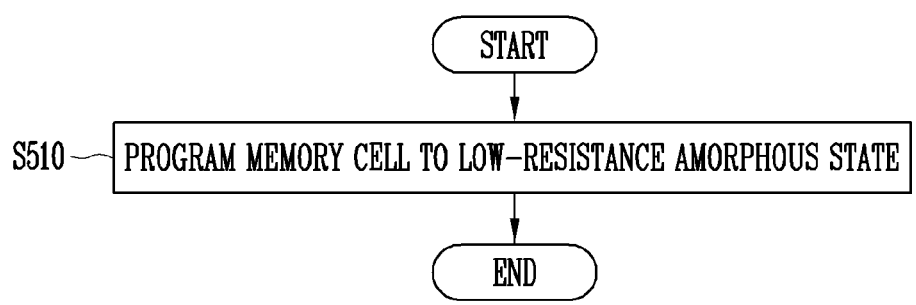
FIG. 5 is a flowchart illustrating a set operation of a memory cell in accordance with an embodiment of the present disclosure.

FIG. 5 is a flowchart illustrating a set operation of a memory cell in accordance with an embodiment of the present disclosure.

Referring to FIG. 5, in the set operation, the memory cell is programmed to a low-resistance amorphous state (S510). Since a variable resistance layer of the memory cell has the OTS characteristic, the variable resistance layer of the memory cell is not phase-shifted, and thus maintains an amorphous state. A memory cell in the set state has a threshold voltage smaller than that of a memory cell in the reset state.

In an embodiment, the set operation is performed by turning on the memory cell. When the memory cell is turned on, a threshold voltage of the memory cell may decrease by a recovery operation. The memory cell may have an initial low-resistance amorphous state having no drift, by turning on the memory cell. Thus, the memory cell may be programmed to the set state and the programmed cell may have the initial low-resistance amorphous state. In the set operation, a pulse that minimizes stress of the memory cell is applied to the memory cell, so that the memory cell can be programmed to the set state, i.e., a lower low-resistance state. The pulse that minimizes the stress may be a pulse that has a low current level and a short pulse width.

In another embodiment, a voltage in the sub-threshold range is applied to the memory cell, and the applied voltage has a level lower than that of the sub-threshold voltage Vsub. For example, a voltage having a lower level than 0.7 times of the threshold voltage Vth of the memory cell is applied to the memory cell, or the voltage is applied to the memory cell for a short time. The threshold voltage Vth of the memory cell increases in the turn-off state, but may be less increased than in the reset state. Accordingly, the memory cell is programmed to the set state.

In still another embodiment, any program operation is not performed on the memory cell. The unprogrammed memory cell has a threshold voltage lower than that of a memory cell in the reset state. Therefore, it can be seen that the memory cell on which any reset operation is not performed is programmed to the set state.

Figure 6:
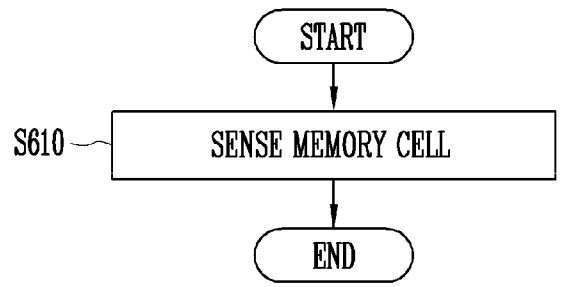
FIG. 6 is a flowchart illustrating a read operation of a memory cell in accordance with an embodiment of the present disclosure.

FIG. 6 is a flowchart illustrating a read operation of a memory cell in accordance with an embodiment of the present disclosure.

Referring to FIG. 6, in the read operation, the memory cell is sensed by applying a read voltage to the memory cell (S610). The read voltage may have a level between the threshold voltage SET_Vth in the set state and a threshold voltage RESET_Vth in the reset state. For example, the read voltage may be (SET_Vth+ RESET_Vth)/2.

When the read voltage is applied to the memory cell in the set state, the memory cell is turned on. When the read voltage is applied to the memory cell in the reset state, the memory cell maintains the turn-off state. Since the memory cell in the reset state is not turned on in the read operation, the memory cell may maintain the reset state even after the read operation.

Figure 7:
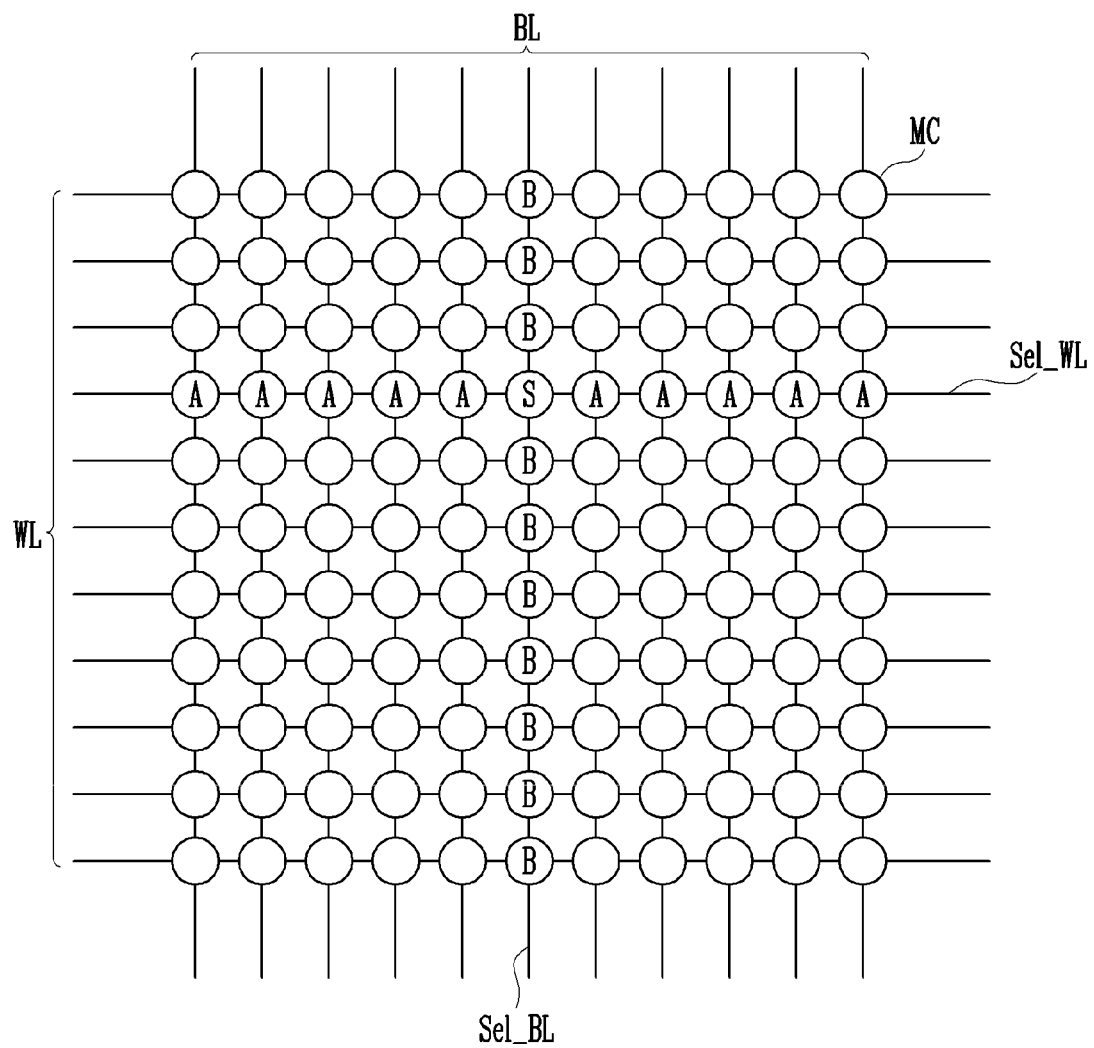
FIG. 7 illustrates a method of operating an electronic device in accordance with an embodiment of the present disclosure.

FIG. 7 illustrates a method of operating an electronic device in accordance with an embodiment of the present disclosure.

Referring to FIG. 7, a memory cell array includes a plurality of word lines WL, a plurality of bit lines BL, and memory cells MC. Hereinafter, an operation of a selected memory cell S will be described with reference to Tables 1 to 3.

Table 1 illustrates voltages applied to the word lines WL and the bit lines BL and voltages applied to both ends of the memory cells MC in a reset operation. In the reset operation, a first voltage is applied to a selected word line sel_WL among the word lines WL, and a second voltage is applied to a selected bit line sel_BL among the bit lines BL. The selected memory cell S is coupled to and disposed between the selected word line sel_WL and the selected bit line sel_BL. The first voltage and the second voltage may have different polarities.

In an embodiment, the first voltage and the second voltage may have opposite polarities. The first voltage may have a negative value, and the second voltage may have a positive value. For example, the first voltage may have a value of $-0.475*Vth$, and the second voltage may have a value of $+0.475*Vth$. Vth may be a threshold voltage of a memory cell having the set state. Accordingly, a sub-threshold voltage of $+0.95*Vth$ is applied to both ends of the selected memory cell S. Thus, the selected memory cell S is programmed from a turn-off state to a reset state.

A ground voltage is applied to unselected word lines among the word lines WL, and is applied to unselected bit lines among the bit lines BL. Accordingly, memory cells connected to and disposed between the unselected bit lines and the unselected word lines are unselected, and a voltage of 0 V is applied to both ends of each of the unselected memory cells.

A voltage of $-0.475*Vth$ is applied to both ends of memory cells A connected to and disposed between the selected word line sel_WL and the unselected bit lines. A voltage of $+0.475*Vth$ is applied to both ends of memory cells B connected to and disposed between the selected bit line sel_BL and the unselected word lines. Since a voltage having a value smaller than that of the sub-threshold voltage $+0.95*Vth$ is applied to the memory cells A and the memory cells B, the memory cells A and the memory cells B are not programmed to the reset state. Herein, the memory cells A and the memory cells B are referred to as 'half-selected memory cells.'

TABLE 1

|  | BL | WL |
| --- | --- | --- |
| Selected memory cell (S) | $+0.475*Vth$ | $-0.475*Vth$ |
| Both-end voltage (V) | | $+0.95*Vth$ |
| Half-selected memory cell (B) | $+0.475*Vth$ | 0 |
| Both-end voltage (V) | | $+0.475*Vth$ |
| Half-selected memory cell (A) | 0 | $-0.475*Vth$ |
| Both-end voltage (V) | | $-0.475*Vth$ |
| Unselected memory cell | 0 | 0 |
| Both-end voltage (V) | | 0 |

Table 2 illustrates voltages applied to the word lines WL and the bit lines BL and voltages applied to both ends of the memory cells MC in a set operation. In the set operation, a third voltage is applied to the selected word line sel_WL among the word lines WL, and a fourth voltage is applied to the selected bit line sel_BL among the bit lines BL. The third voltage and the fourth voltage may have different polarities.

In an embodiment, the third voltage and the fourth voltage may have opposite polarities. The third voltage may have a negative value, and the fourth voltage may have a positive value. For example, the third voltage may have a value of −0.5*Vth, and the fourth voltage may have a value of +0.5*Vth. Vth may be a threshold voltage of a memory cell having the reset state. Accordingly, a voltage of +Vth is applied to both ends of the selected memory cell S. Thus, the selected memory cell S is turned on, and is programmed to the set state.

The ground voltage is applied to the unselected word lines among the word lines WL, and is applied to the unselected bit lines among the bit lines BL. Accordingly, memory cells connected to and disposed between the unselected bit lines and the unselected word lines are unselected, and a voltage of 0 V is applied to both ends of the unselected memory cells.

A voltage of −0.5*Vth is applied to both ends of the memory cells A connected to and disposed between the selected word line sel_WL and the unselected bit line. A voltage of +0.5*Vth is applied to both ends of the memory cells B connected to and disposed between the selected bit line sel_BL and the unselected word line. The memory cells A and the memory cells B maintain the turn-off state, and is not programmed to the set state.

TABLE 2

|  | BL | WL |
|---|---|---|
| Selected memory cell (S) | +0.5*Vth | −0.5*Vth |
| Both-end voltage (V) |  | +Vth |
| Half-selected memory cell (B) | +0.5*Vth | 0 |
| Both-end voltage (V) |  | +0.5*Vth |
| Half-selected memory cell (A) | 0 | −0.5*Vth |
| Both-end voltage (V) |  | −0.5*Vth |
| Unselected memory cell | 0 | 0 |
| Both-end voltage (V) |  | 0 |

Table 3 illustrates voltages applied to the word lines WL and the bit lines BL and voltages applied to both ends of the memory cells MC in a read operation. In the read operation, a first read voltage is applied to the selected word line sel_WL among the word lines WL, and a second read voltage is applied to the selected bit line sel_BL among the bit lines BL. The first read voltage and the second read voltage may have different polarities.

In an embodiment, the first read voltage and the second read voltage may have opposite polarities. The first read voltage may have a negative value, and the second read voltage may have a positive value. For example, the first read voltage may have a value of −0.5*Vread, and the second read voltage may have a value of +0.5*Vread. Vread may have a value that is greater than the threshold voltage of the memory cell in the set state and is smaller than the threshold voltage of the memory cell in the reset state. Accordingly, a voltage of +Vread is applied to both ends of the selected memory cell S. Thus, when the selected memory cell S is in the reset state, the selected memory cell S maintains the turn-off state. When the selected memory cell S is in the set state, the selected memory cell S is turned on.

The ground voltage is applied to the unselected word lines among the word lines WL, and is applied to the unselected bit lines among the bit lines BL. Accordingly, the memory cells connected to and disposed between the unselected bit lines and the unselected word lines are unselected, and a voltage of 0 V is applied to both ends of the unselected memory cells.

A voltage of −0.5*Vread is applied to both ends of the memory cells A connected to and disposed between the selected word line sel_WL and the unselected bit line. A voltage of +0.5*Vread is applied to both ends of the memory cells B connected to and disposed between the selected bit line sel_BL and the unselected word line. Thus, the memory cells A and the memory cells B maintain the turn-off state, regardless of stored data.

TABLE 3

|  | BL | WL |
|---|---|---|
| Selected memory cell (S) | +0.5*Vread | −0.5*Vread |
| Both-end voltage (V) |  | +Vread |
| Half-selected memory cell (B) | +0.5*Vread | 0 |
| Both-end voltage (V) |  | +0.5*Vread |
| Half-selected memory cell (A) | 0 | −0.5*Vread |
| Both-end voltage (V) |  | −0.5*Vread |
| Unselected memory cell | 0 | 0 |
| Both-end voltage (V) |  | 0 |

Figure 8:
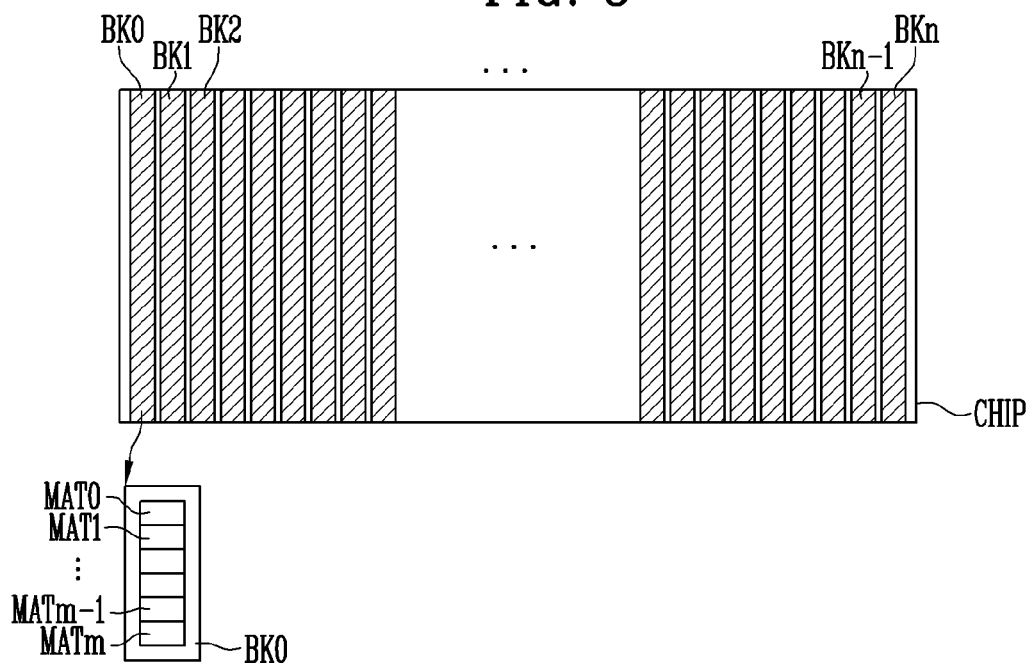
FIG. 8 illustrates a method of operating a memory cell in accordance with an embodiment of the present disclosure.

FIG. 8 illustrates a method of operating a memory cell in accordance with an embodiment of the present disclosure. FIG. 8 shows the configuration of a memory chip.

Referring to FIG. 8, a memory chip CHIP may include a plurality of memory blocks BK0 to BKn. In addition, each of the memory blocks BK0 to BKn may include a plurality of MATs MAT0 to MATm, where n and m each may be an integer of 1 or more. Each of the MATs MAT0 to MATm may include the memory cell array 100. The memory chip CHIP may be a die, and the memory blocks BK0 to BKn may be banks.

In an embodiment, the sub-threshold voltage Vsub may be set in the unit of the memory chip CHIP, or in the unit of a die. A value that is smaller than the lowest threshold voltage in a threshold voltage distribution of memory cells included in the memory chip CHIP may be set as the sub-threshold voltage Vsub. Therefore, according to the threshold voltage distribution, different sub-threshold voltages Vsub may be set to the memory chips CHIP.

In an embodiment, the sub-threshold voltage Vsub may be set in the unit of the memory blocks BK0 to BKn, or in the unit of banks. A value that is smaller than the lowest threshold voltage in a threshold voltage distribution of memory cells included in each of the memory blocks BK0 to BKn may be set as the sub-threshold voltage Vsub. Therefore, according to the threshold voltage distribution, different sub-threshold voltages Vsub may be set to the memory blocks BK0 to BKn.

In an embodiment, the sub-threshold voltage Vsub may be set in the unit of the MATs MAT. A value that is smaller than the lowest threshold voltage in a threshold voltage distribution of memory cells included in the MAT MAT may be set as the sub-threshold voltage Vsub. Therefore, according to the threshold voltage distribution, different sub-threshold voltages Vsub may be set to the MATs MAT.

Figure 9:
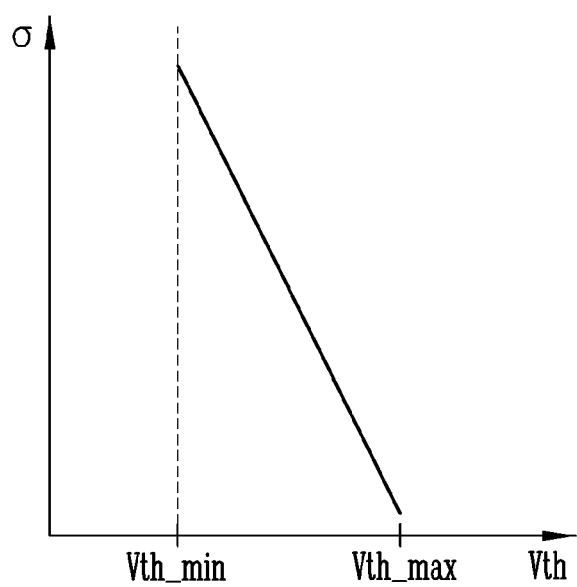
FIG. 9 is a graph showing a threshold voltage distribution in accordance with an embodiment of the present disclosure.

FIG. 9 is a graph showing a threshold voltage distribution of memory cells in accordance with an embodiment of the present disclosure.

Referring to FIG. 9, memory cells included in one memory chip may have a threshold voltage distribution. In the same manner, memory cells included in one memory block or one MAT may have a threshold voltage distribution. The threshold voltage distribution may be caused by process variation. When a plurality of memory cells are formed at the same time, the deposition thickness of layers may not be uniform or an etch depth may not be uniform. As a result, the threshold voltage distribution may be caused.

Therefore, the sub-threshold voltage Vsub may be determined in consideration of a threshold voltage distribution of memory cells. The threshold voltage distribution may have a minimum threshold voltage Vth_min and a maximum threshold voltage Vth_max. The minimum threshold voltage Vth_min and the maximum threshold voltage Vth_max may be the lowest value and the highest value in a normal distribution, except for an abnormal memory cell. The sub-threshold voltage Vsub may be greater than 0.7 times of the minimum threshold voltage Vth_min and smaller than 0.95 times of the minimum threshold voltage Vth_min.

Figure 10:
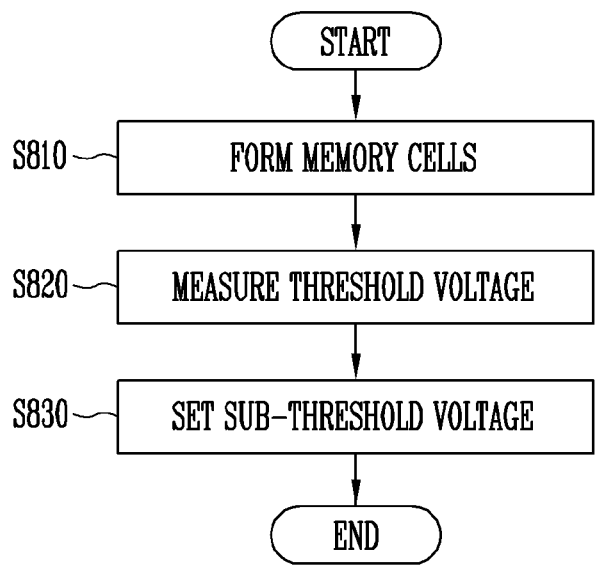
FIG. 10 is a flowchart illustrating a method of determining a sub-threshold voltage in accordance with an embodiment of the present disclosure.

FIG. 10 is a flowchart illustrating a method of determining a sub-threshold voltage in accordance with an embodiment of the present disclosure.

Referring to FIG. 10, memory cells may be formed (S810). Each of the memory cells may include a variable resistance layer that maintains an amorphous state regardless a value of stored data.

Then, threshold voltages of the memory cells may be measured (S820). In an embodiment, the threshold voltages of the memory cells may be measured at a wafer test process. The entire distribution of the threshold voltages may be checked by performing a read operation while changing a level of a read voltage. Memory cells that fall out of a normal distribution may be determined as abnormal memory cells. Through the threshold voltage distribution, the minimum threshold voltage Vth_min and the maximum threshold voltage Vth_max may be checked. The minimum threshold voltage Vth_min and the maximum threshold voltage Vth_max may be the lowest value and the highest value of the normal distribution.

In an embodiment, when the sub-threshold voltage Vsub is set in the unit of a memory chip, threshold voltages of memory cells included in each memory chip may be measured. In an embodiment, when the sub-threshold voltage Vsub is set in the unit of a memory block, threshold voltages of memory cells included in each memory block may be measured.

The sub-threshold voltage Vsub may be set (S830). A level of the sub-threshold voltage Vsub may be set so as not to turn on a memory cell that has the minimum threshold voltage Vth_min. The sub-threshold voltage Vsub may be greater than 0.7 times of the minimum threshold voltage Vth_min and smaller than 0.95 times of the minimum threshold voltage Vth_min. The set sub-threshold voltage Vsub may be stored in a set value storage circuit, a fuse, or the like.

Figure 11:
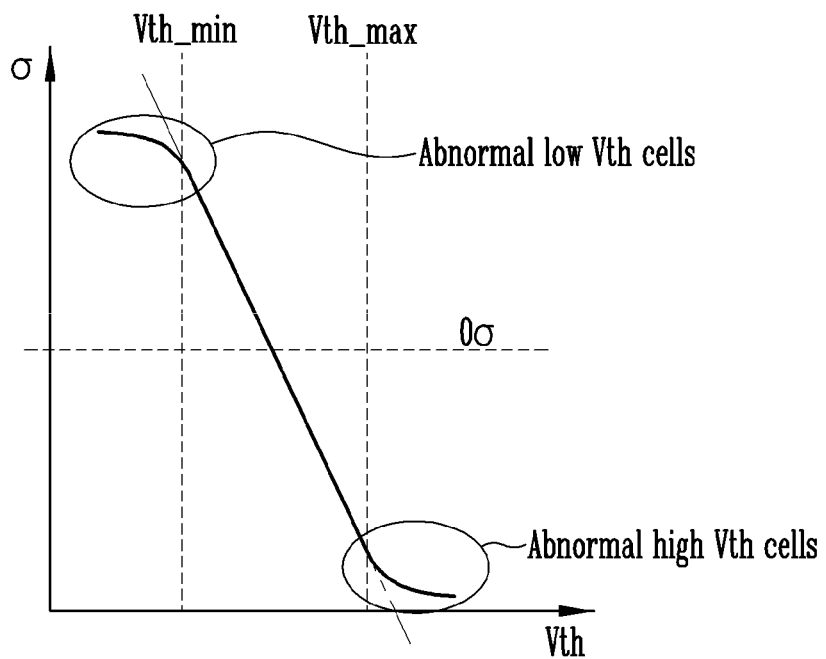
FIG. 11 is a graph showing a threshold voltage distribution of memory cells in accordance with an embodiment of the present disclosure.

FIG. 11 is a graph showing a threshold voltage distribution of memory cells in accordance with an embodiment of the present disclosure.

Referring to FIG. 11, memory cells having threshold voltages that fall out of a normal distribution may be abnormal memory cells. In an embodiment, a memory cell that has a threshold voltage smaller than the minimum threshold voltage Vth_min, or a memory cell that has a threshold voltage greater than the maximum threshold voltage Vth_max may be an abnormal memory cell. The abnormal memory cell may be processed as failed. The cell processed as failed may be replaced by a redundancy cell.

In an embodiment, when one of the memory cells that share a bit line or a word line has an abnormally low threshold voltage, the corresponding memory cell may be processed as failed and may be replaced by a redundancy cell. In addition, the replaced memory cell may affect access to the other memory cells that share the bit line or the word line with the corresponding memory cell. Therefore, the other memory cells may also be replaced by redundancy cells.

In an embodiment, a ratio (Vsub/Vth_max) of the sub-threshold voltage Vsub and the maximum threshold voltage Vth_max may be 0.7 or more. For example, when the sub-threshold voltage Vsub is 0.95 times as much as the minimum threshold voltage Vth_min, Vth_min*0.95/Vth_max may be 0.7. A ratio (Vth_min/Vth_max) of the minimum threshold voltage Vth_min and the maximum threshold voltage Vth_max may be greater than 0.737. The maximum threshold voltage Vth_max may be smaller than 1.36*Vth_min. As a result, deterioration in effect of a program operation using the sub-threshold voltage Vsub caused by the abnormally high threshold voltage may be prevented.

In an embodiment, a threshold voltage distribution is 70 mV/σ and the minimum threshold voltage Vth_min may be 4.0 V. When (Vth_min*0.95)/Vth_max is set to be greater than 0.8, the maximum threshold voltage Vth_max may be 4.75 V or less. When it is assumed that 4.0 V which is the minimum threshold voltage Vth_min is a value corresponding to +4.5σ, 4.75 V which is the maximum threshold voltage Vth_max may be a value corresponding to −6.2σ in the distribution. Therefore, a sufficient margin with respect to the maximum threshold voltage Vth_max may be ensured.

The memory circuits or semiconductor devices of the above-described embodiments may be used for various devices or systems. FIGS. 12 to 16 respectively illustrate a device or system employing any of the memory circuits or semiconductor devices of the above-described embodiments.

Figure 12:
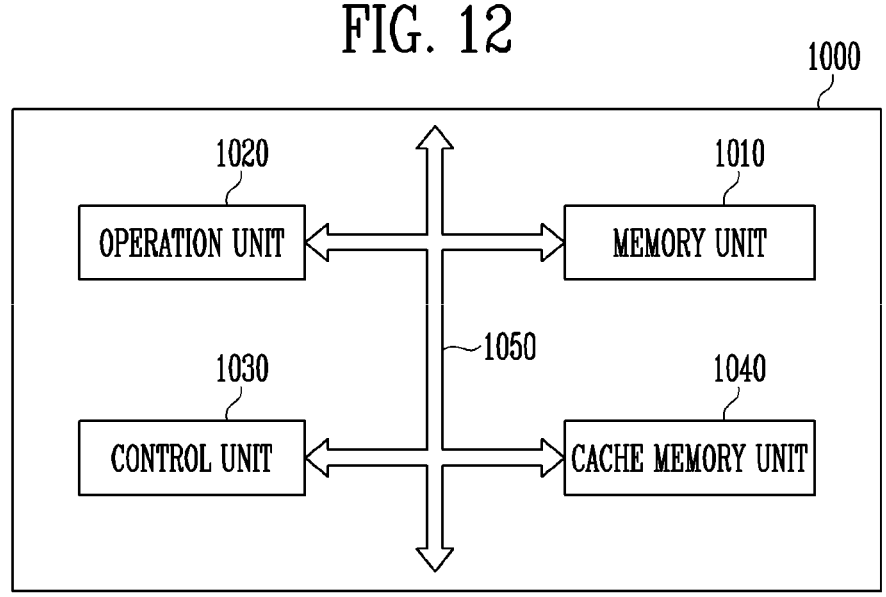
FIG. 12 is a configuration view of a microprocessor employing a memory device in accordance with an embodiment of the present disclosure.

FIG. 12 is a configuration view of a microprocessor 1000 employing a memory device in accordance with an embodiment of the present disclosure.

Referring to FIG. 12, the microprocessor 1000 may perform tasks for controlling and tuning a series of processes of receiving data from various external devices, processing the data, and outputting processing results to the external devices. The microprocessor 1000 may include a memory unit 1010, an operation unit 1020, a control unit 1030, and the like. The microprocessor 1000 may be any of various data processing units such as a central processing unit (CPU), a graphic processing unit (GPU), a digital signal processor (DSP), an application processor (AP), and the like.

The memory unit 1010 stores data in the microprocessor 1000 as a processor register, register, or the like. The memory unit 1010 may include any of various registers such as a data register, an address register, a floating point register, and the like. The memory unit 1010 may temporarily store data for which operations are to be performed by the operation unit 1020, resultant data obtained by performing the operations, and addresses where data for performing the operations are stored.

The memory unit 1010 may include the memory device in accordance with the above-described embodiments. For example, the memory unit 1010 may include word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells. Accordingly, read operation characteristics of the memory unit 1010 can be improved. Consequently, read operation characteristics of the microprocessor 1000 can be also improved.

The operation unit 1020 may perform several arithmetical operations or logical operations according to results that the control unit 1030 decodes commands. The operation unit 1020 may include at least one arithmetic logic unit (ALU) or the like.

The control unit 1030 may receive signals from the memory unit 1010, the operation unit 1020, and an external device of the microprocessor 1000, extract or decode commands, control input and output of signals of the microprocessor 1000, and execute processing represented by programs.

The microprocessor 1000 may additionally include a cache memory unit 1040 which can temporarily store data to be input from an external device or to be outputted to an external device. The cache memory unit 1040 may exchange data with the memory unit 1010, the operation unit 1020, and the control unit 1030 through a bus interface 1050.

Figure 13:
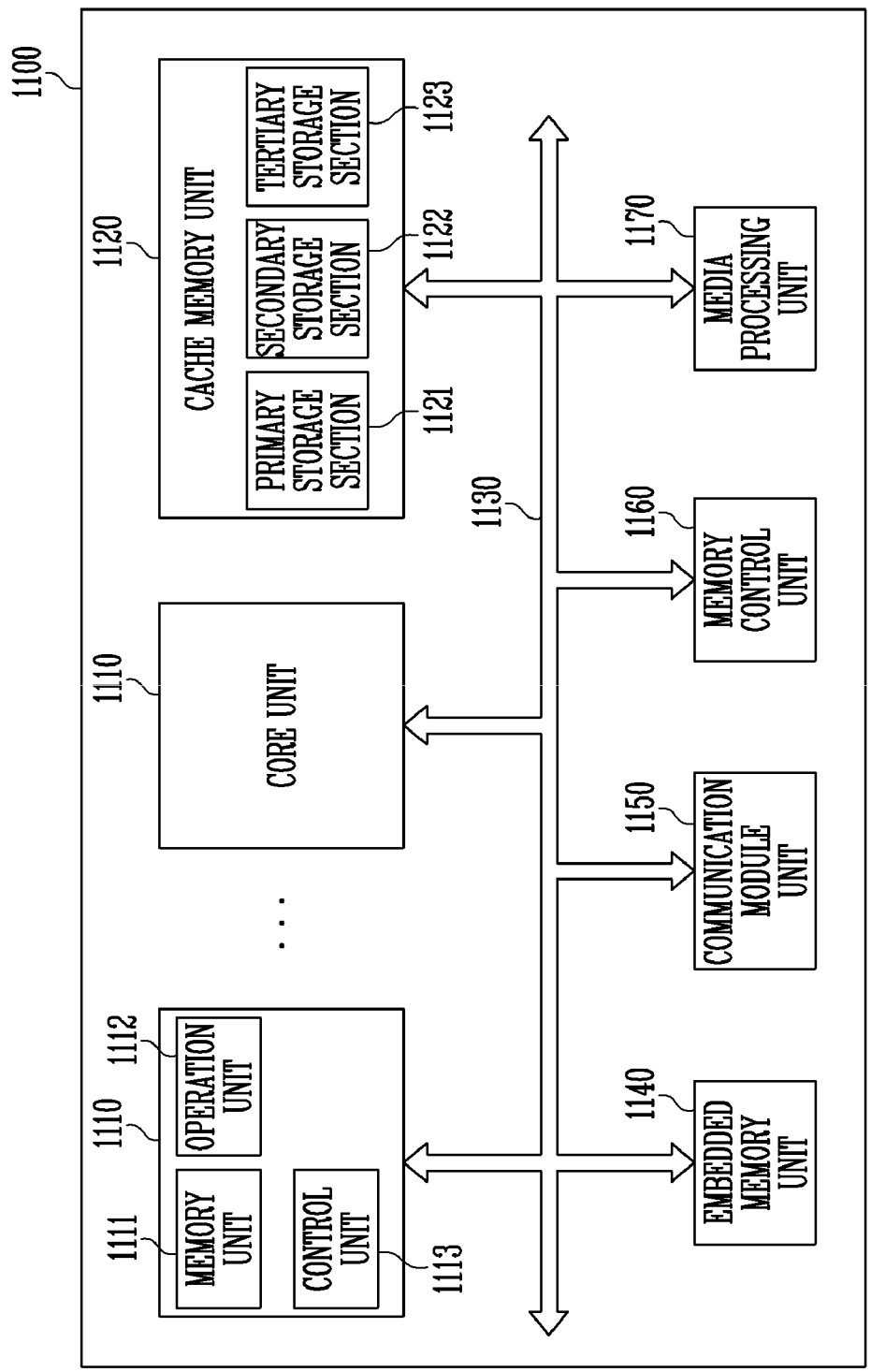
FIG. 13 is a configuration view of a processor employing a memory device in accordance with an embodiment of the present disclosure.

FIG. 13 is a configuration view of a processor 1100 employing a memory device in accordance with an embodiment of the present disclosure.

Referring to FIG. 13, the processor 1100 may improve performance and realize multi-functionality by including various functions in addition to the functions of the microprocessor described above with reference to FIG. 12. The processor 1100 may include a core unit 1110 serving as a microprocessor, a cache memory unit 1120 for storing data temporarily, and a bus interface 1130 for transferring data between internal and external devices. The processor 1100 may include any of a multi-core processor, a graphic processing unit (GPU), an application processor (AP), and so on.

In an embodiment, the core unit 1110 may perform arithmetic and logic operations on data input from an external device, and may include a memory unit 1111, an operation unit 1112, and a control unit 1113.

The memory unit 1111 may store data in the processor 1100 as a processor register, a register, or the like. The memory unit 1111 may include any of various registers such as a data register, an address register, a floating point register, and the like. The memory unit 1111 may temporarily store data for which operations are to be performed by the operation unit 1112, resultant data obtained by performing the operations, and addresses where data for performing the operations are stored.

The operation unit 1112 may perform operations in the processor 1100. The operation unit 1112 may perform several arithmetical operations and/or logical operations according to results that the control unit 1113 decodes commands. The operation unit 1112 may include at least one arithmetic logic unit (ALU) or the like.

The control unit 1113 may receive signals from the memory unit 1111, the operation unit 1112, and an external device of the processor 1100, extract or decode commands, control input and output of signals of the processor 1100, and execute processing represented by programs.

The cache memory unit 1120 may temporarily store data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may further include the tertiary storage section 1123 in the case where high storage capacity is required. As the occasion demands, the cache memory unit 1120 may include more storage sections. That is, the number of storage sections which are included in the cache memory unit 1120 may be changed according to a design.

The primary, secondary, and tertiary storage sections 1121, 1122, and 1123 may have the same or different processing speeds for storing and sensing data. When the respective storage sections 1121, 1122, and 1123 have different processing speeds, the primary storage section 1121 may have the highest processing speed among the storage sections 1121, 1122, and 1123. At least one storage section of the primary storage section 1121, the secondary storage section 1122, and the tertiary storage section 1123 of the cache memory unit 1120 may include one or more of the above-described embodiments. For example, the cache memory unit 1120 may include word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells. Accordingly, read operation characteristics of the cache memory unit 1120 can be improved. Consequently, read operation characteristics of the processor 1100 can be also improved.

Although a case where all the primary, secondary, and tertiary storage sections 1121, 1122, and 1123 are configured inside the cache memory unit 1120 is illustrated in FIG. 13, all the primary, secondary, and tertiary storage sections 1121, 1122, and 1123 of the cache memory unit 1120 may be configured outside the core unit 1110 to compensate for a difference in data processing speed between the core unit 1110 and an external device. Alternatively, the primary storage section 1121 of the cache memory unit 1120 may be disposed inside the core unit 1110, and the secondary storage section 1122 and the tertiary storage section 1123 may be configured outside the core unit 1110 to strengthen the function of compensating for a difference in data processing speed. Alternatively, the primary and secondary storage sections 1121 and 1122 may be disposed inside the core unit 1110 and the tertiary storage section 1123 may be disposed outside the core unit 1110.

The bus interface 1130 may connect the core unit 1110, the cache memory unit 1120, and an external device so that data is efficiently transmitted therebetween.

In another embodiment, the processor 1100 may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the number of primary storage sections 1121 of the cache memory unit 1120 may correspond to the number of the plurality of core units 1110. Each of the primary storage sections 1121 may be included in each of the core units 1110. The secondary storage section 1122 and the tertiary storage section 1123 may be configured outside the plurality of core units 1110 and shared by the plurality of core units 1110 through the bus interface 1130. The processing speed of the primary storage section 1121 may be faster than the processing speeds of the secondary and tertiary storage sections 1122 and 1123.

In another embodiment, the primary storage section 1121 and the secondary storage section 1122 may be configured in each core unit 1110, and the tertiary storage section 1123 may be configured outside the plurality of core units 1110 and shared by the plurality of core units 1110 through the bus interface 1130.

The processor 1100 in accordance with this embodiment may further include an embedded memory unit 1140 which stores data, a communication module unit 1150 which transmits and receives data to and from an external device in a wired or wireless manner, a memory control unit 1160 which drives an external memory device, and a media processing unit 1170 which processes data processed in the processor 1100 or data input from an external input device and outputs the processed data to an external interface device. Besides, the processor 1100 may include a plurality of various modules and devices. The plurality of modules which are added to the processor 1100 may exchange data with the core units 1110 and the cache memory unit 1120 and with one another, through the bus interface 1130.

The embedded memory unit 1140 may include not only a volatile memory but also a non-volatile memory. The volatile memory may include a DRAM (dynamic random access memory), a mobile DRAM, an SRAM (static random access memory), or the like. The non-volatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or the like.

The communication module unit 1150 may include a module connected to a wired network, a module connected to a wireless network, or both. The wired network module may include a local area network (LAN), a universal serial bus (USB), an Ethernet, power line communication (PLC), or the like, which transmits and receives data through transmission lines. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), or the like, which transmits and receives data without transmission lines.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processing unit 1170 may process data processed in the processor 1100 or data input in the forms of image, voice, and others from an external input device, and output the processed data to an external interface device. The media processing unit 1170 may include a graphic processing unit (GPU), a digital signal processor (DSP), a high definition audio device (HD audio), a high definition multimedia interface (HDMI) controller, or the like.

Figure 14:
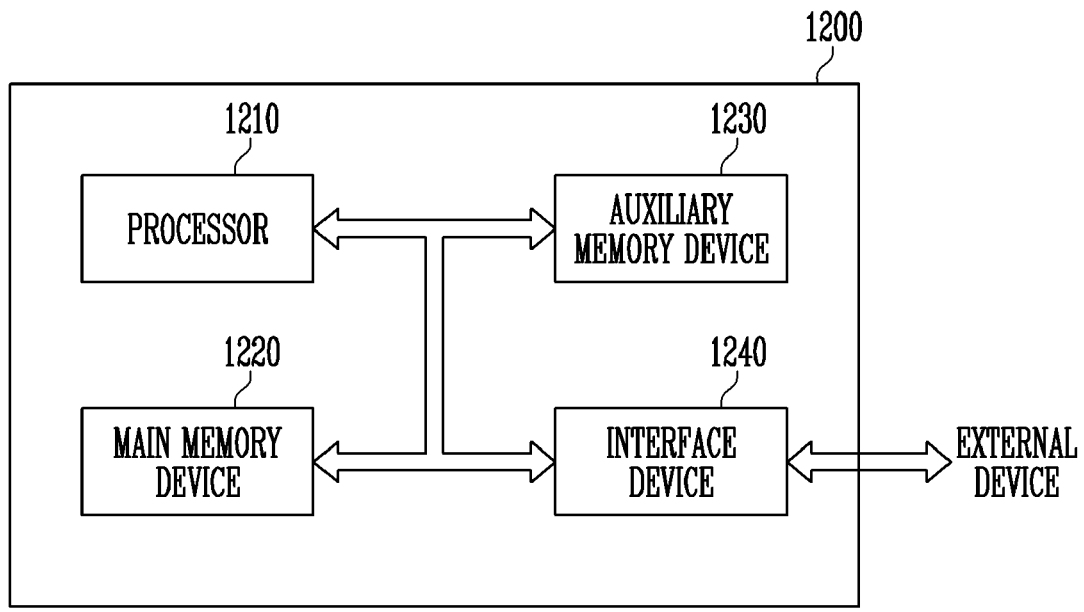
FIG. 14 is a configuration view of a system employing a memory device in accordance with an embodiment of the present disclosure.

FIG. 14 is a configuration view of a system employing a memory device in accordance with an embodiment of the present disclosure.

Referring to FIG. 14, the system 1200 as an apparatus for processing data may perform inputting, processing, outputting, communicating, storing, etc. to perform a series of operations on data. The system 1200 may include a processor 1210, a main memory device 1220, an auxiliary memory device 1230, an interface device 1240, and the like. The system 1200 of this embodiment may be any of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, or the like.

The processor 1210 may control the decoding of inputted commands and the processing of data stored in the system 1200. The processor 1210 may include one or more of a microprocessor unit (MPU), a central processing unit (CPU), a single/multi-core processor, a graphic processing unit (GPU), an application processor (AP), a digital signal processor (DSP), and the like.

The main memory device 1220 is a storage which can temporarily store, extract, and execute program codes or data from the auxiliary memory device 1230 when programs are executed, and can conserve stored contents even when power supply is cut off. The main memory device 1220 may include the memory device in accordance with the above-described embodiments. For example, the main memory device 1220 may include word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells. Accordingly, read operation characteristics of the main memory device 1220 can be improved. Consequently, read operation characteristics of the system 1200 can be also improved.

Also, the main memory device 1220 may further include one or more of a static random access memory (SRAM), a dynamic random access memory (DRAM), and the like, which lose all contents stored therein when power supply is cut off. Unlike this, the main memory device 1220 may not include the memory device in accordance with the above-described embodiments, and may include one or more of a static random access memory (SRAM), a dynamic random access memory (DRAM), and the like.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include the memory device in accordance with the above-described embodiments. For example, the auxiliary memory device 1230 may include word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells. Accordingly, read operation characteristics of the auxiliary memory device 1230 can be improved. Consequently, read operation characteristics of the system 1200 can be also improved.

Also, the auxiliary memory device 1230 may further include a data storage system such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

In another embodiment, the auxiliary memory device 1230 may not include the memory device in accordance with the above-described embodiments, but may include a data storage system such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The interface device 1240 may perform exchange of commands and data between the system 1200 and an external device. The interface device 1240 may include one or more of a keypad, a keyboard, a mouse, a speaker, a mike, a display, various human interface devices (HIDs), a communication device, and the like. The communication device may include a module connected to a wired network, a module connected to a wireless network, or both. The wired network module may include a local area network (LAN), a universal serial bus (USB), an Ethernet, power line communication (PLC), or the like, which sends and receives data through transmission lines. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), or the like, which sends and receives data without transmission lines.

Figure 15:
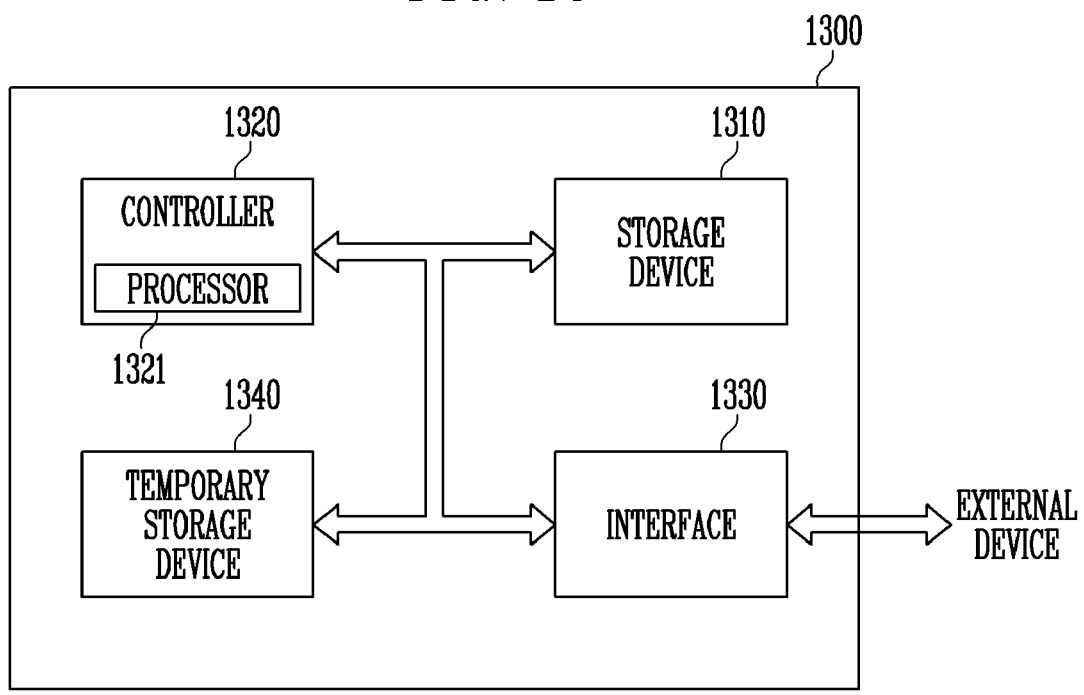
FIG. 15 is a configuration view of a data storage system employing a memory device in accordance with an embodiment of the present disclosure.

FIG. 15 is a configuration view of a data storage system employing a memory device in accordance with an embodiment of the present disclosure.

Referring to FIG. 15, the data storage system 1300 may include a storage device 1310 which has a non-volatile characteristic as a component for storing data, a controller 1320 which controls the storage device 1310, an interface 1330 for communicating with an external device, and a temporary storage device 1340 for storing data temporarily. The data storage system 1300 may be a disk type device such as a hard disk drive (HDD), a compact disc read only memory (CDROM), a digital versatile disc (DVD), a solid state disk (SSD), or the like, or a card type device such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The storage device 1310 may include a non-volatile memory. The non-volatile memory may include any of a ROM (read only memory), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 for processing commands inputted through the interface 1330 from an outside of the data storage system 1300.

The interface 1330 is to perform exchange of commands and data between the data storage system 1300 and the external device. When the data storage system 1300 is a card type device, the interface 1330 may be compatible with interfaces which are used in devices such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. When the data storage system 1300 is a disk type device, the interface 1330 may be compatible with interfaces such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like. The interface 1330 may be compatible with one or more interfaces having a different type from each other.

The temporary storage device 1340 can store data temporarily for efficiently transferring data between the interface 1330 and the storage device 1310 according to an interface with an external device and diversifications and high performance of a controller and a system. The temporary storage device 1340 for temporarily storing data may include the memory device in accordance with the above-described embodiments. For example, the temporary storage device 1340 may include word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells. Accordingly, read operation characteristics of the temporary storage device 1340 can be improved. Consequently, read operation characteristics of the data storage system 1300 can be also improved.

Figure 16:
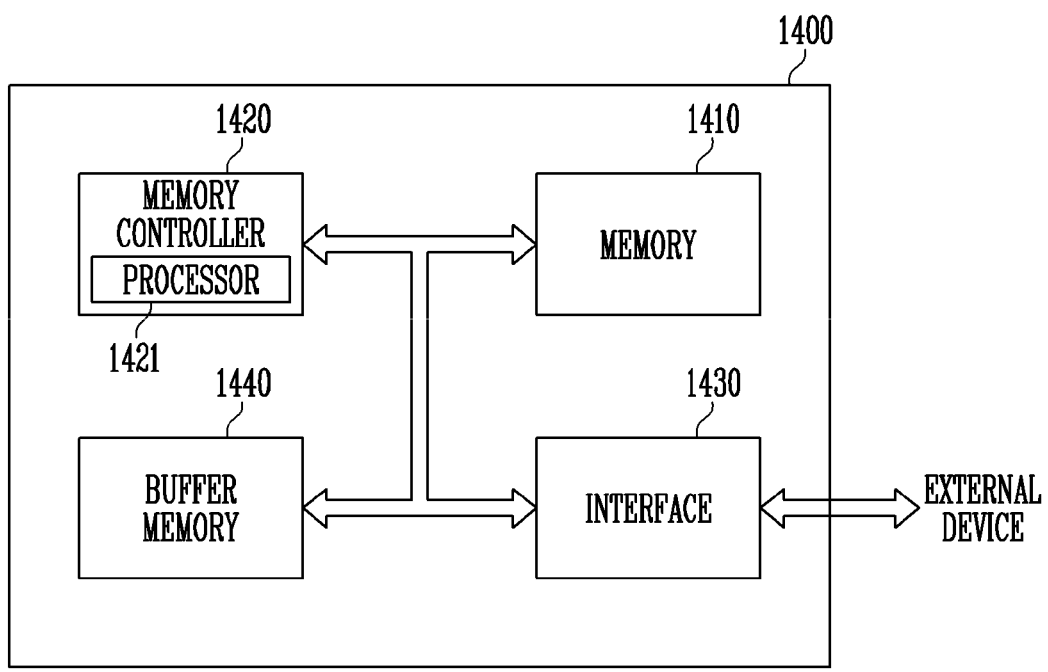
FIG. 16 is a configuration view of a memory system employing a memory device in accordance with an embodiment of the present disclosure.

FIG. 16 is a configuration view of a memory system employing a memory device in accordance with an embodiment of the present disclosure.

Referring to FIG. 16, the memory system 1400 may include a memory 1410 which has a non-volatile characteristic as a component for storing data, a memory controller 1420 which controls the memory 1410, an interface 1430 for communicating with an external device, and the like. The memory system 1400 may be a card type device such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The memory 1410 for storing data may include the memory device in accordance with the above-described embodiments. For example, the memory 1410 may include word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells. Accordingly, read operation characteristics of the memory 1410 can be improved. Consequently, read operation characteristics of the memory system 1400 can be also improved.

Also, the memory 1410 may further include a ROM (read only memory), a NOR flash memory, a NAND flash memory, a phase change random access memory (PRAM), a resistive random access memory (RRAM), a magnetic random access memory (MRAM), or the like.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. The interface 1430 may be compatible with one or more interfaces having a different type from each other.

The memory system 1400 may further include a buffer memory 1440 for efficiently transferring data between the interface 1430 and the memory 1410 according to an interface with an external device and diversification and high performance of a memory controller and a memory system. The buffer memory 1440 for temporarily storing data may include the memory device in accordance with the above-described embodiments. For example, the buffer memory 1440 may include word lines; bit lines intersecting the word lines; and memory cells coupled to and disposed between the word lines and the bit lines, each of the memory cells including a variable resistance layer in an amorphous state regardless of a value of data stored in the memory cells, and wherein, in a reset operation, a memory cell is programmed to a high-resistance amorphous state by applying, to the memory cell, a sub-threshold voltage that is lower than a lowest threshold voltage among threshold voltages of the memory cells. Accordingly, read operation characteristics of the buffer memory 1440 can be improved. Consequently, read operation characteristics of the memory system 1400 can be also improved.

Moreover, the buffer memory 1440 may further include an SRAM (static random access memory), a DRAM (dynamic random access memory), or the like, which has a volatile characteristic, and a phase change random access memory (PRAM), a resistive random access memory (RRAM), a spin transfer torque random access memory (STTRAM), a magnetic random access memory (MRAM), or the like, which has a non-volatile characteristic.

In another embodiment, the buffer memory 1440 may not include the memory device in accordance with the above-described embodiments, but may include an SRAM (static random access memory), a DRAM (dynamic random access memory), or the like, which has a volatile characteristic, and a phase change random access memory (PRAM), a resistive random access memory (RRAM), a spin transfer torque random access memory (STTRAM), a magnetic random access memory (MRAM), or the like, which has a non-volatile characteristic.

In the electronic device in accordance with the present disclosure, the operation characteristics and reliability of the memory cell can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising a semiconductor memory,
wherein the semiconductor memory comprises:
word lines;
bit lines intersecting the word lines; and
memory cells coupled to and disposed between the word lines and the bit lines, each of the memory cells including a variable resistance layer in an amorphous state regardless of a value of data stored in the memory cell,
wherein, in a reset operation, a memory cell is programmed to a high-resistance amorphous state by applying, to the memory cell, a sub-threshold voltage that is lower than a lowest threshold voltage among threshold voltages of the memory cells without another voltage applying operation.

2. The electronic device of claim 1, wherein the sub-threshold voltage is set in a unit of a memory chip.

3. The electronic device of claim 1, wherein the sub-threshold voltage is set in a unit of a memory bank.

4. The electronic device of claim 1, wherein the sub-threshold voltage is set in a unit of a MAT.

5. The electronic device of claim 1, wherein a ratio of the sub-threshold voltage and a highest threshold voltage is greater than 0.7.

6. The electronic device of claim 1, wherein a ratio of the lowest threshold voltage and a highest threshold voltage is greater than 0.737.

7. The electronic device of claim 1, wherein a highest threshold voltage is smaller than 1.36 times of the lowest threshold voltage.

8. The electronic device of claim 1, wherein the sub-threshold voltage is greater than 0.7 times of the lowest threshold voltage and is smaller than 0.95 times of the lowest threshold voltage.

9. The electronic device of claim 1, wherein the memory cell maintains a turn-off state during the reset operation.

10. The electronic device of claim 1, wherein the memory cell is programmed to the high-resistance amorphous state or a low-resistance amorphous state, and wherein, in a read operation, a read voltage is applied to the memory cell, and the read voltage has a value between a threshold voltage of the memory cell programmed to the high-resistance amorphous state and a threshold voltage of the memory cell programmed to the low-resistance amorphous state.

11. A method for operating an electronic device including memory cells, the method comprising:

performing a reset operation of programming a selected memory cell among the memory cells to a high-resistance amorphous state by applying a sub-threshold voltage to the selected memory cell without another voltage applying operation, wherein the sub-threshold voltage is lower than a lowest threshold voltage among threshold voltages of the memory cells, and wherein each of the memory cells includes a variable resistance layer in an amorphous state regardless of a value of data stored in the memory cell.

12. The method of claim 11, wherein the sub-threshold voltage is set in a unit of a memory chip.

13. The method of claim 11, wherein the sub-threshold voltage is set in a unit of a memory bank.

14. The method of claim 11, wherein the sub-threshold voltage is set in a unit of a MAT.

15. The method of claim 11, wherein the sub-threshold voltage is greater than 0.7 times of the lowest threshold voltage and is smaller than 0.95 times of the lowest threshold voltage.

16. A method of manufacturing an electronic device including memory cells, the method comprising:

forming memory cells, each of the memory cells including a variable resistance layer in an amorphous state regardless of a value of data stored in the memory cell;

measuring threshold voltages of the memory cells; and setting a sub-threshold voltage to be lower than a lowest threshold voltage among the threshold voltages of the memory cells, wherein a reset operation of programming a selected memory cell among the memory cells to a high-resistance amorphous state is performed by applying the sub-threshold voltage to the selected memory cell without another voltage applying operation.

17. The method of claim 16, wherein the sub-threshold voltage is set in a unit of a memory chip.

18. The method of claim 16, wherein the sub-threshold voltage is set in a unit of a memory bank.

19. The method of claim 16, wherein the sub-threshold voltage is set in a unit of a MAT.

20. The method of claim 16, wherein the sub-threshold voltage is greater than 0.7 times of the lowest threshold voltage and is smaller than 0.95 times of the lowest threshold voltage.

* * * * *